United States Patent
Higgins et al.

(10) Patent No.: US 8,426,798 B2
(45) Date of Patent: Apr. 23, 2013

(54) ELECTRICAL TERMINATION CIRCUIT FOR A TRAVELING-WAVE OPTOELECTRONIC DEVICE

(75) Inventors: Brian Higgins, Oxford, CT (US); Gregory J. McBrien, Glastonbury, CT (US)

(73) Assignee: JDS Uniphase Corporation, Milpitas, CA (US)

( * ) Notice: Subject to any disclaimer, the term of this patent is extended or adjusted under 35 U.S.C. 154(b) by 357 days.

(21) Appl. No.: 12/859,735

(22) Filed: Aug. 19, 2010

(65) Prior Publication Data

US 2011/0049335 A1    Mar. 3, 2011

Related U.S. Application Data

(60) Provisional application No. 61/235,298, filed on Aug. 19, 2009.

(51) Int. Cl.
  *G01J 1/44* (2006.01)
(52) U.S. Cl.
  USPC ............. 250/214 C; 250/214.1; 250/227.11; 359/238; 359/245
(58) Field of Classification Search .............. 250/214 R, 250/214.1, 214 C, 227.11; 356/481, 477
See application file for complete search history.

(56) References Cited

U.S. PATENT DOCUMENTS

| | | | |
|---|---|---|---|
| 5,138,480 A | 8/1992 | Dolfi et al. | 359/251 |
| 5,572,610 A | 11/1996 | Toyohara | 385/14 |
| 5,671,302 A | 9/1997 | Skeie | 385/2 |
| 5,675,673 A | 10/1997 | Skeie | 385/2 |
| 5,854,862 A | 12/1998 | Skeie | 385/2 |
| 6,535,320 B1 * | 3/2003 | Burns | 359/245 |
| 6,763,151 B1 | 7/2004 | Bosso et al. | 385/3 |
| 6,909,817 B2 | 6/2005 | Bosso et al. | 385/3 |
| 7,058,265 B2 | 6/2006 | Amparan et al. | 385/40 |
| 7,345,803 B2 | 3/2008 | Nakajima et al. | 359/237 |
| 7,558,444 B2 * | 7/2009 | Shimizu et al. | 385/2 |
| 7,643,708 B2 | 1/2010 | Kawano et al. | 385/3 |
| 7,668,417 B2 | 2/2010 | Jiang et al. | 385/14 |
| 7,711,215 B2 | 5/2010 | Kawanishi et al. | 385/3 |
| 2006/0068748 A1 * | 3/2006 | Irie et al. | 455/333 |

* cited by examiner

*Primary Examiner* — Francis M Legasse, Jr.
(74) *Attorney, Agent, or Firm* — Matthew A. Pequignot; Pequignot + Myers

(57) ABSTRACT

An electrical termination circuit for a traveling wave optoelectronic device is disclosed. The electrical termination circuit is constructed to reflect a portion of a radio-frequency signal back into the optoelectronic device. The reflected signal is out of phase with the applied radio-frequency signal at a frequency of a detrimental spectral feature or a bump in an electro-optical transfer characteristic of the optoelectronic device. The amplitude and the phase of the reflected signal are selected so as to suppress the detrimental spectral feature without a significant reduction in the efficiency of electro-optical or optical-electrical transformation of the optoelectronic device.

17 Claims, 8 Drawing Sheets

ELECTRICAL TERMINATION CIRCUIT FOR A TRAVELING-WAVE OPTOELECTRONIC DEVICE

CROSS-REFERENCE TO RELATED APPLICATIONS

The present invention claims priority from U.S. Provisional application No. 61/235,298 filed Aug. 19, 2009, which is incorporated herein by reference for all purposes.

TECHNICAL FIELD

The present invention relates to termination of waveguide devices, and in particular to electrical termination of traveling-wave optoelectronic devices.

BACKGROUND OF THE INVENTION

Optoelectronic devices are used to convert between electrical and optical signals. For example, in fiber optic communications, optical modulators are used to convert an electrical information carrying signal into an optical modulated signal. In an optical modulator, an electrical signal is applied to a material having an optical property dependent on an electric field or an electric current within the material. A light wave traveling through the material is thus modulated by the electrical signal. To improve the efficiency of modulation while keeping a high modulation frequency, the light wave and the electrical signal (a radio-frequency electromagnetic wave) can be made to co-propagate in the material. Optoelectronic devices employing co-propagation of light and electrical signals belong to a class of so called traveling-wave devices.

Referring to FIG. 1, a prior-art traveling-wave optical modulator 100 is shown. The traveling-wave optical modulator 100 includes two waveguides 102 and 104 formed in an electro-optic crystal such as lithium niobate, and two 3 dB couplers 106 and 108 forming a Mach-Zehnder interferometer 110, an interaction region 112 along the lower waveguide 104, the interaction region 112 defined by two electrodes 114 and 116, and a terminating resistor 118 coupled to the lower electrode 116. In operation, an optical signal (an optical wave) 120 is provided to an input port 122 of the optical modulator 100. A driver 124 generates an electrical modulating signal 126 applied to the lower electrode 116. The optical signal 120 and the electrical signal 126, in form of a radio-frequency (RF) electromagnetic wave, co-propagate in the interaction region 112. The RF wave 126 causes a slight modulation of the refractive index of the lower waveguide 104. A wave of the refractive index modulation travels with the speed of the RF wave 126 in the interaction region 112. The refractive index modulation results in a change of a phase of the co-propagating optical wave 120. The change of the phase of the optical wave 120 is translated into a change of optical power of the optical signal at the output 3 dB coupler 108. The intensity-modulated optical signal 120 exits the traveling-wave optical modulator 100 at an output port 128 thereof. The electrical modulating signal 126 is terminated by the terminating resistor 118 having a real impedance matched to that of a RF transmission line formed by the electrodes 114 and 116. The impedance is matched to prevent undesirable reflections of the modulating RF wave 126 back into the driver 124.

One important characteristic of the prior-art modulator 100 is a frequency response function (or so-called "S21" function). The frequency response function is a degree of modulation of the optical signal 120 as a function of frequency of the electrical signal 126. For the prior-art modulator 100 to produce a high-quality, low jitter optical modulated signal, the frequency response function has to be as smooth and even as practically achievable. Detrimentally, the frequency response function of the prior-art modulator 100 usually has a spectral ripple due to parasitic electrical couplings and acoustic resonance effects caused by electrostriction in the electro-optic crystal the waveguides 102 and 104 are formed in, or more specifically, in the interaction region 112 of the crystal. This spectral ripple is difficult to remove, because the electrostriction in electro-optic crystals has the same physical origins as the electro-optical effect used to effect the phase modulation on the optical signal 120.

The problems of spectral ripple and a roll-off of the frequency response function of an optical modulator are well recognized in the art. A number of approaches aiming to reduce the spectral ripple and flatten the frequency response function have been suggested.

One approach is to provide a custom front-end electrical filter 130 to compensate for undesired spectral features in the frequency response function of the traveling-wave optical modulator 100, or to design a gain spectral characteristic of the driver 124 to mirror the undesired spectral features, so they can be subtracted. The latter approach is disclosed by Shimizu et al. in U.S. Pat. No. 7,558,444, incorporated herein by reference. Detrimentally, incorporating front-end filters, such as the filter 130 in FIG. 1, results in a reduction of the efficiency of modulation.

Nakajima et al. in U.S. Pat. No. 7,345,803, incorporated herein by reference, discloses a method of correcting a high-frequency roll-off of a response function of an optical modulator by providing an inductance connected in series or in parallel to the RF transmission line of the optical modulator. The inductance effectively alters the impedance of a termination circuit, which can reduce the roll-off of the response function. Detrimentally, the technique of Nakajima does not address a problem of acoustically caused ripple in the response function, because of the narrowness of the spectral features caused by acoustic resonances in the electro-optic crystal.

Other approaches to reduce acoustically caused ripple and improve overall flatness of the response characteristic include lowering the resistance of the terminating resistor 118; doping the electro-optic crystal; providing a resistive conformal coating on the electro-optic crystal; or altering geometry of the electrodes 114 and 116. For example, Skeie in U.S. Pat. Nos. 5,854,862; 5,675,673; 5,671,302 incorporated herein by reference; and Dolfi et al. in U.S. Pat. No. 5,138,480, incorporated herein by reference, disclose traveling wave optical modulators, which have segmented electrodes of a complex spatially varying shape. Detrimentally, these approaches result in raising a magnitude of the electrical signal 126 required to drive the traveling-wave optical modulator 100.

The prior art is lacking a technique that would allow one to inexpensively and effectively reduce or suppress detrimental spectral ripple of the response function of an optoelectronic device. Accordingly, it is a goal of the present invention to provide such a technique and a device.

SUMMARY OF THE INVENTION

According to the invention, undesirable spectral features in the response function of traveling wave optical modulators and other optoelectronic devices are suppressed by providing an electrical termination circuit constructed to reflect at least a part of the electrical signal back into the optoelectronic device. The signal reflected has an in-quadrature frequency component at the frequency of the undesirable spectral features, so as to suppress these features.

In accordance with the invention there is provided an electrical termination circuit for a traveling-wave optoelectronic device, comprising a first resistive element and a reactive element,
wherein the traveling-wave optoelectronic device has a transfer characteristic having a spectral feature at a first frequency of a radio-frequency (RF) wave traveling through the optoelectronic device, wherein the spectral feature is caused by acoustic effects in the optoelectronic device; and
wherein the first resistive element and the reactive element have such a resistance and a reactance, which, in use, create a reflected RF wave having a component in quadrature with the traveling RF wave at the first frequency, for suppressing the spectral feature caused by the acoustic effects in the optoelectronic device.

In accordance with another aspect of the invention there is further provided an electrical termination circuit for a traveling-wave optoelectronic device, comprising a transmission line having a length, wherein the transmission line is terminated with a termination unit,
wherein the traveling-wave optoelectronic device has a transfer characteristic having a spectral feature at a first frequency of an RF wave traveling through the optoelectronic device, wherein the spectral feature is caused by acoustic effects in the optoelectronic device; and
wherein the length of the transmission line and a position of the transmission line are selected so as to cause the electrical termination circuit to create a reflected RF wave having a component in quadrature with the traveling RF wave at the first frequency, for suppressing the spectral feature caused by the acoustic effects in the optoelectronic device.

In accordance with another aspect of the invention there is further provided an optical device comprising:
a traveling-wave optoelectronic device having a transfer characteristic having a spectral feature at a first frequency of an RF wave traveling through the optoelectronic device, wherein the spectral feature is caused by acoustic effects in the optoelectronic device; and
an electrical termination circuit coupled to the traveling-wave optoelectronic device, the electrical termination circuit comprising a resistive element and a reactive element,
wherein the resistive element and the reactive element have such a resistance and a reactance, which, in use, create a reflected RF wave having a component in quadrature with the traveling RF wave at the first frequency, for suppressing the spectral feature caused by the acoustic effects in the optoelectronic device.

In one embodiment, the electrical termination circuit of the optical device includes a transmission line having such a length, position, and a termination impedance, so as to create the in-quadrature component of the reflected RF wave.

In accordance with another aspect of the invention there is provided a method for terminating a traveling-wave optoelectronic device, comprising:
(a) providing a traveling-wave optoelectronic device having a transfer characteristic having a spectral feature at a first frequency of an RF wave traveling through the optoelectronic device, wherein the spectral feature is caused by acoustic effects in the optoelectronic device;
(b) selecting a first resistive element and a reactive element for an electrical termination circuit; and/or selecting a length, a position, and a termination impedance of a transmission line in an electrical termination circuit for the traveling-wave optoelectronic device, so as to create in operation a reflected wave having a component in quadrature with the traveling wave at the first frequency, for suppressing the spectral feature caused by acoustic effects in the optoelectronic device; and
(c) terminating the traveling-wave optoelectronic device with the electrical termination circuit of step (b).

In accordance with the invention there is further provided an electrical termination circuit for a traveling-wave optoelectronic device having an electro-optical transfer characteristic having a spectral ripple feature at a first frequency of a traveling electromagnetic wave propagating through the optoelectronic device, the electrical termination circuit comprising a resistive element and a reactive element connected in parallel, wherein the resistive element and the reactive element have such a resistance and a reactance that, in operation, the electrical termination circuit creates a reflected electromagnetic wave having a component in quadrature with the traveling electromagnetic wave at the first frequency, whereby in operation, the spectral ripple feature of the electro-optical transfer characteristic is suppressed.

In general, an electrical termination circuit of the invention allows one to create an almost arbitrary waveform scaled and phase-shifted relative to the traveling wave signal, for canceling or suppressing undesirable spectral features of the transfer function of a traveling-wave optoelectronic device.

BRIEF DESCRIPTION OF THE DRAWINGS

Exemplary embodiments will now be described in conjunction with the drawings in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
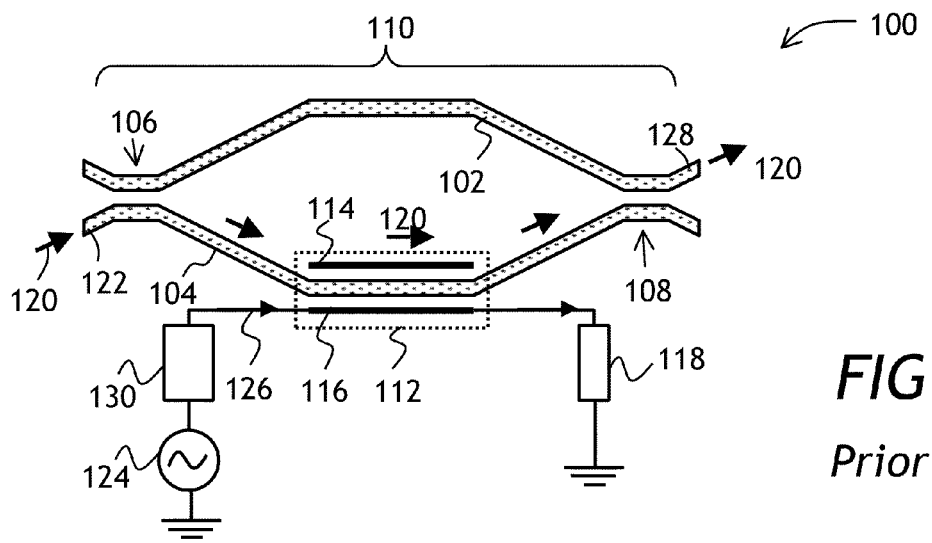
FIG. 1 is a diagram of a prior-art optical modulator.
Figure 2:
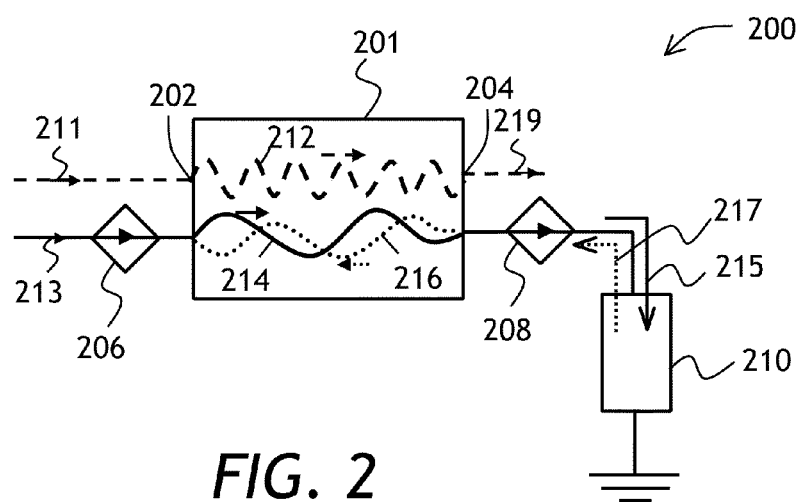
FIG. 2 is a diagram of an optical modulator terminated with an electrical termination circuit of the invention.

Referring to FIG. 2, a traveling-wave optical modulator 200 has an electro-optic crystal 201, optical input and output ports 202 and 204, respectively, and electrical input and output ports 206 and 208, respectively. The traveling-wave optical modulator 200 is terminated with an electrical termination circuit 210 coupled to the output electrical port 208. In operation, an optical signal 211 provided at the optical input port 202 propagates in the electro-optic crystal 201 towards the optical output port 204 in form of a traveling optical wave 212. The traveling optical wave 212 is guided by a waveguide, not shown, in the electro-optic crystal 201. An electrical signal 213 provided at the electrical input port 206 co-propagates with the optical wave 212 in an electrical waveguide, not shown, towards the electrical output port 208 as a traveling radio-frequency (RF) wave 214. The traveling RF wave 214 modulates the co-propagating traveling optical wave 212 due to an electro-optical effect (Pockels effect) in the electro-optic crystal 201. A modulated optical signal 219 exits the optical modulator 200 at the optical output port 204. The RF wave 214 exits the optical modulator 200 at the electrical output port 208 as an output electrical signal 215. The output electrical signal 215 proceeds to the termination circuit 210. The termination circuit 210 is constructed so as to reflect a fraction 217 of the output electrical signal 215 so as to create a reflected back-propagating RF wave 216 in the electro-optic crystal 201. The traveling-wave optical modulator 200 can be a Mach-Zehnder optical modulator, with a Mach-Zehnder interferometer formed in the electro-optic crystal 201, an electroabsorption modulator, or any other type of a traveling-wave modulator.

Figure 3:
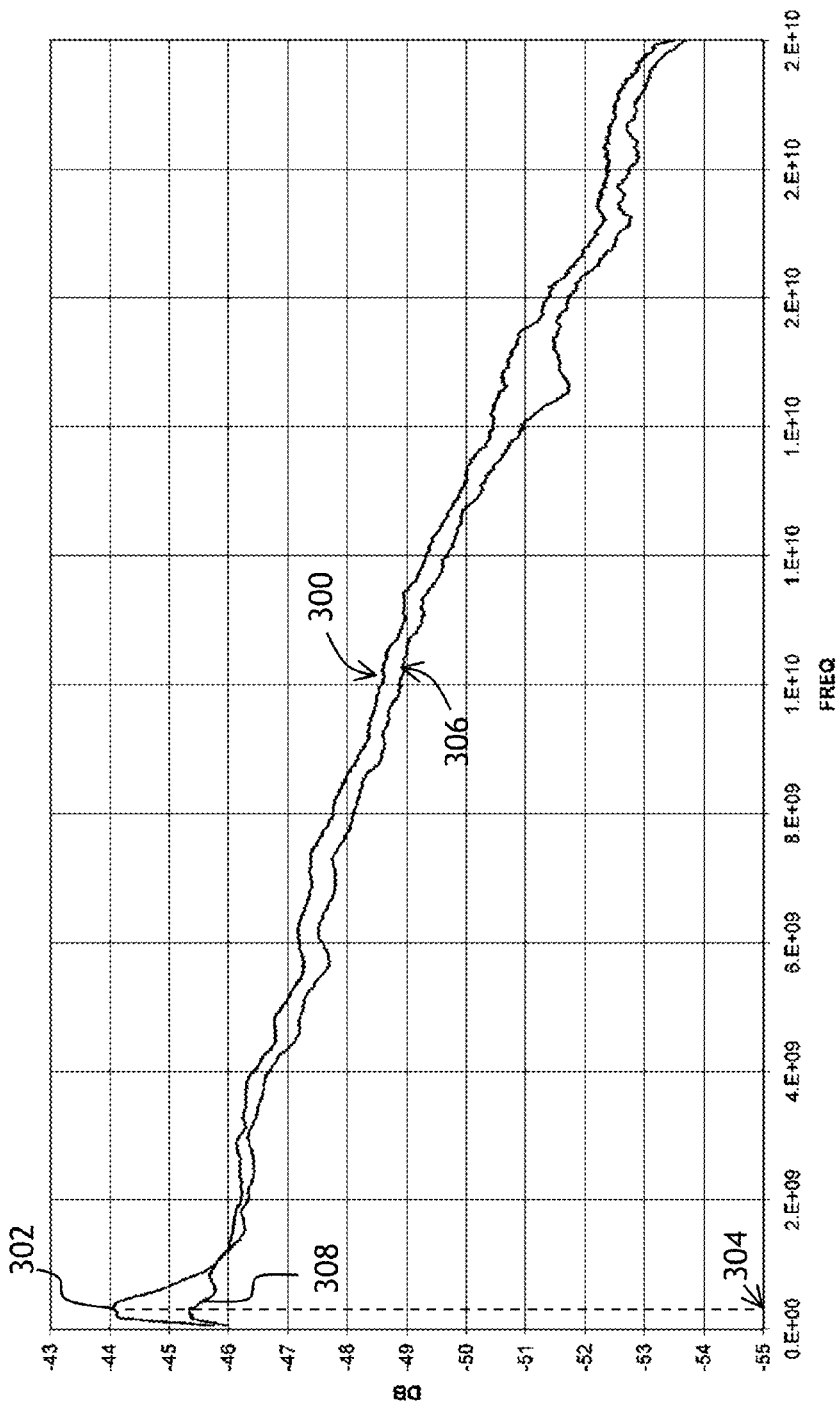
FIG. 3 is a transfer characteristic of the optical modulator of FIG. 2 terminated with an impedance-matching terminating circuit and with the electrical termination circuit of FIG. 2.

The effect of the termination circuit 210 and the reflected RF wave 216 on an electro-optical transfer characteristic of the traveling-wave optical modulator 200 will now be explained. Turning to FIG. 3, an electro-optical transfer characteristic 300 is obtained by terminating the traveling-wave optical modulator 200 with a terminating resistor, not shown, having an impedance that is matched to that of the electrical waveguide of the traveling-wave optical modulator 200. The electro-optical transfer characteristic 300 has a spectral feature (a bump) 302 at a frequency 304 of approximately 300 MHz. The spectral feature 302 is caused by acoustic resonance effects in the electro-optical crystal 201 of the optoelectronic device 200. The presence of the spectral feature 302 in the electro-optical transfer characteristic 300 is undesirable because it leads to distortion and jitter of the modulated optical signal 219.

Still referring to FIG. 3, an electro-optical transfer characteristic 306 is obtained by terminating the traveling-wave optical modulator 200 with the termination circuit 210 of the invention. When the traveling-wave optical modulator 200 is terminated with the termination circuit 210, the spectral feature 302 is suppressed, as can be seen at 308. The spectral feature 302 is suppressed due to the presence of the reflected back-propagating RF wave 216.

Figure 4:
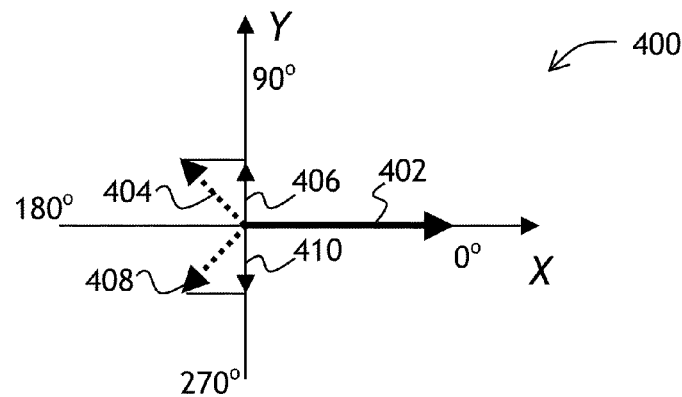
FIG. 4 is a vector diagram of a forward-going radio-frequency (RF) signal and a signal reflected from the electrical termination circuit of FIG. 2.

Turning to FIG. 4, the complex amplitude of the reflected back-propagating RF wave 216 is illustrated by means of a vector diagram 400. A vector 402 denotes the complex amplitude of the traveling RF wave 214 at the frequency 304 of the spectral feature 302. The vector 402 is parallel to the X axis, corresponding to the phase of 0 degrees of the traveling RF wave 214. A smaller vector 404 denotes the complex amplitude of the reflected back-propagating RF wave 216 at the frequency 304 of the spectral feature 402. The smaller vector 404 corresponds to the phase of about 135 degrees of the reflected back-propagating RF wave 216. A vertical vector 406 denotes an in-quadrature component of the reflected back-propagating RF wave 216. It has been found that when the reflected back-propagating RF wave 216 has an amplitude of 8%±4% of an amplitude of the traveling RF wave 214 and a phase of 135°±30° or 225°±30° relative to a phase of the traveling RF wave 214 at the frequency 304 of the spectral feature 302, the acoustically caused feature 302 of the transfer characteristic of the traveling-wave optical modulator 200 is suppressed, as shown at 308 in FIG. 3. The vectors 408 and 410 denote an alternative complex amplitude and an associated in-quadrature component, respectively, of the reflected back-propagating RF wave 216 at the frequency 304 of the spectral feature 302. The complex amplitude 408 has a phase delay of 225°±30° relative to the phase of the traveling RF wave 214. It has been found that when the reflected back-propagating RF wave 216 has the complex amplitude 408, suppression of the spectral feature 302 is also observed.

The out-of-phase condition for suppressing the spectral feature 302, that is, the presence of the in-quadrature components 406 or 410 in the reflected back-propagating RF wave 216, is believed to be related to a phase delay generally observed at a resonance of a mechanical oscillation. Specifically, a phase delay exists between the traveling RF wave 214 causing an acoustic wave to form in the electro-optic crystal 201, and the actual acoustic oscillations in the electro-optic crystal 201 at a local acoustic resonance responsible for appearance of the spectral feature 302. When the reflected back-propagating RF wave 216 is delayed in phase relative to the traveling RF wave 214 driving the acoustic oscillation, the suppression of the oscillation becomes possible.

Figure 5:
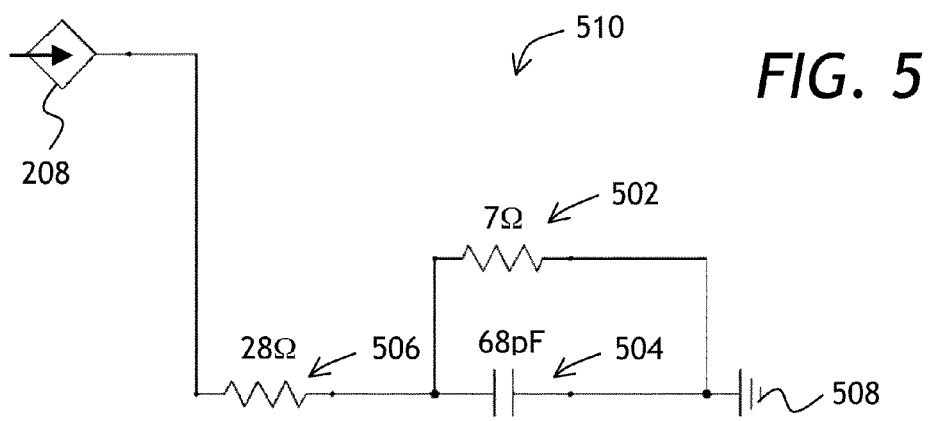
FIGS. 5 and 6 are diagrams of two embodiments of an electrical termination circuit of FIG. 2.

Referring now to FIG. 5, an electrical termination circuit 510 can be used to obtain the reflected back-propagating RF wave 216 for suppressing the spectral feature 302 of the electro-optical transfer characteristic 300. The electrical termination circuit 510 is an exemplary embodiment of the termination circuit 210 for terminating the traveling wave optical modulator 200. The electrical termination circuit 510 includes a first resistive element 502 connected in parallel with a reactive, in this case capacitive, element 504. The first resistive element 502 is connected in series with a second resistive element 506. The second resistive element 506 is connected with the output electrical port 208. The first resistive element 502 is connected to a ground electrode 508. In the exemplary termination circuit 510 shown, the first and the second resistive elements have resistances of 7 Ohm and 28 Ohm, respectively, and the capacitive element 504 has a capacitance of 68 pF. Other values of resistances and capacitances can of course be used to suppress detrimental spectral features in a transfer characteristic at other frequencies.

Figure 6:
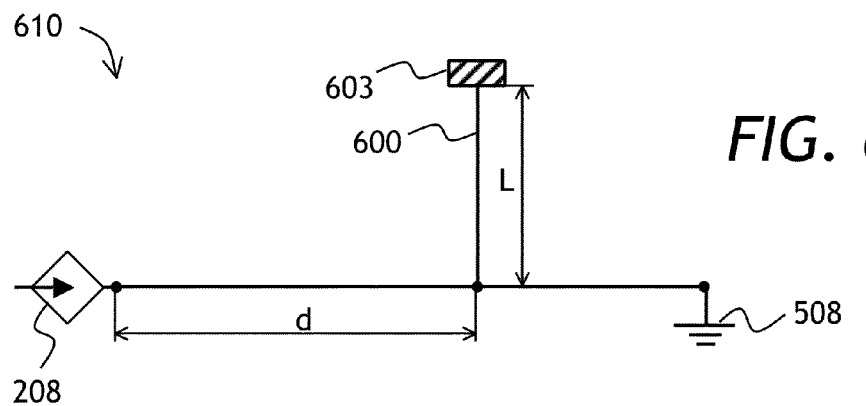

Turning to FIG. 6, an electrical termination circuit 610 is an alternative embodiment of the termination circuit 210. The electrical termination circuit 610 includes a transmission line 600 disposed at a distance d from the electrical output port 208. The transmission line 600 of a length L is terminated by a termination unit 603. The length L, the distance d, and/or the impedance of the termination unit 603 are selected so as to cause the electrical termination circuit 610 to create the reflected back-propagating RF wave 216 having the complex amplitude 404 or 408, for suppressing the spectral bump 302. The termination unit 603 can include resistive and reactive elements.

Figure 7:
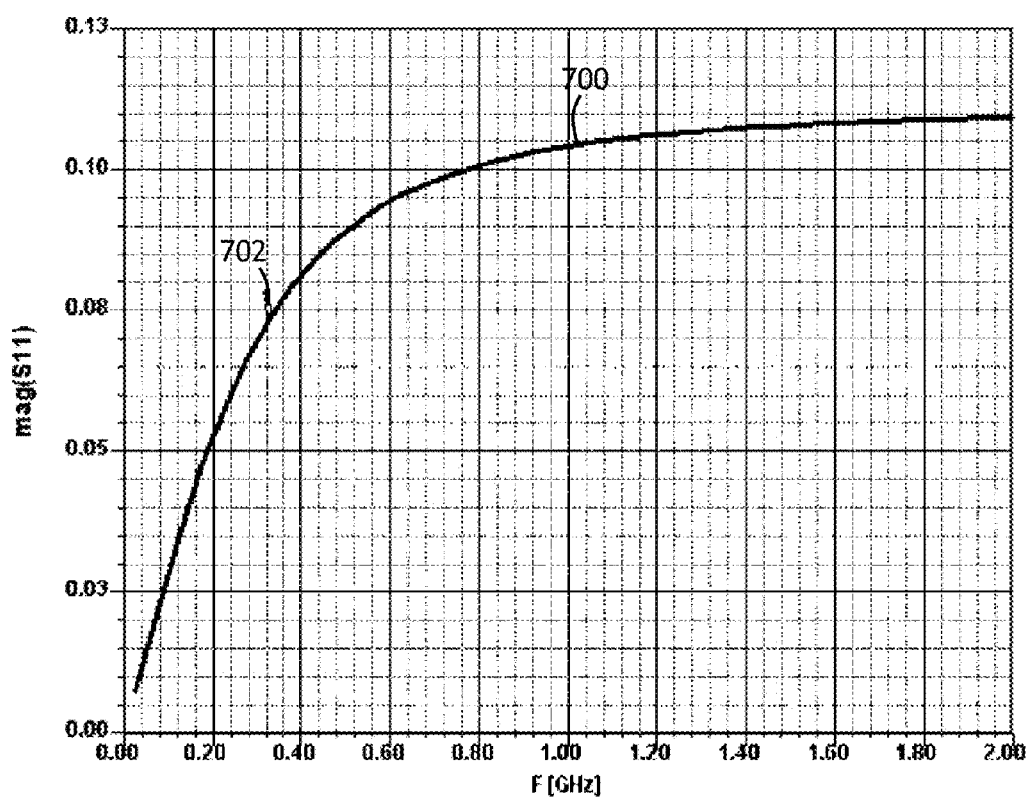
FIGS. 7 and 8 are spectra of the magnitude and the phase, respectively, of an electrical signal reflected by the electrical termination circuit of FIG. 5.
Figure 8:
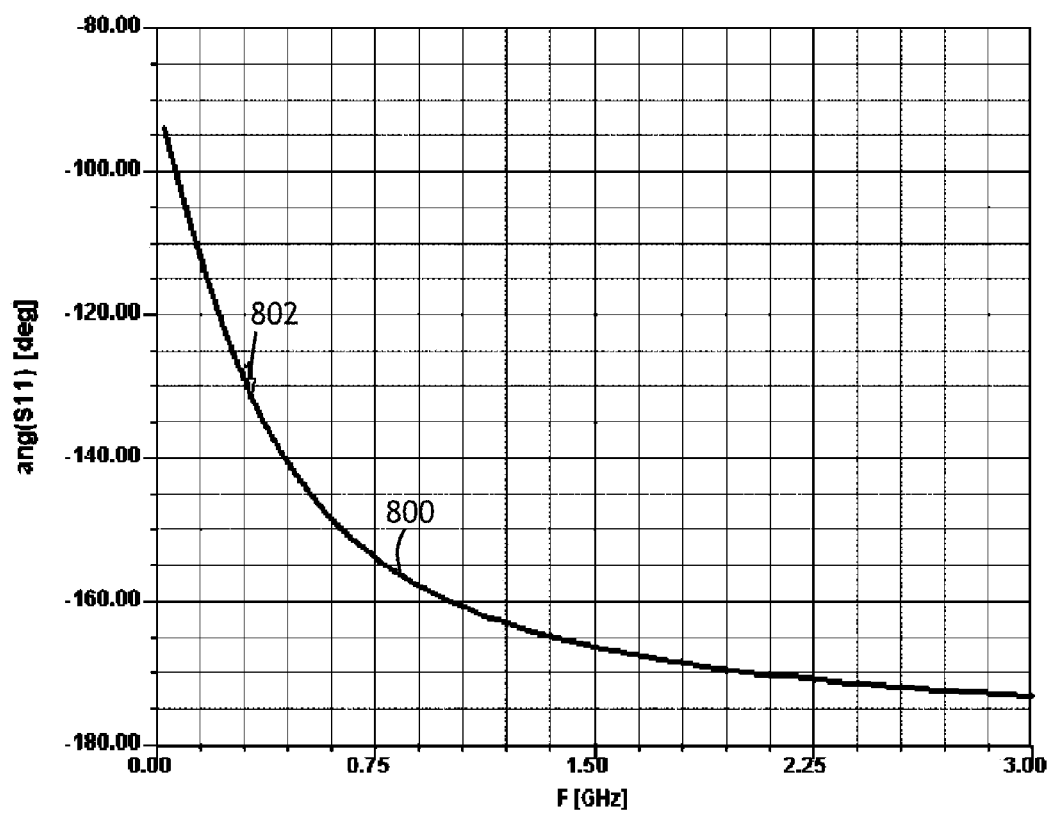

Referring now to FIGS. 7 and 8, spectral plots 700 and 800 of the magnitude and the phase of the reflected back-propagating RF wave 216 reflected by the electrical termination circuit 510 are shown, respectively. The resistance values of the first and the second resistive elements 502 and 506, and the capacitance of the reactive element 504 are selected so as to create the reflected RF wave 216 having a nominal amplitude of 8% of the traveling RF wave 214 at the frequency 304 of the spectral feature 302, and a nominal phase difference with said traveling RF wave 214 of 135 degrees. These values of amplitude and phase are marked in FIGS. 7 and 8 at 702 and 802, respectively. The resistance values of 7 Ohm and 28 Ohm are selected so as to match the impedance of 35 Ohm of the traveling-wave optical modulator 200 at zero frequency.

Referring back to FIG. 3, it is seen that at these resistance values, and at the capacitance value of 68 pF, the spectral feature 302 is suppressed at a modulation loss penalty of only about 0.5 dB or less.

Figure 9:
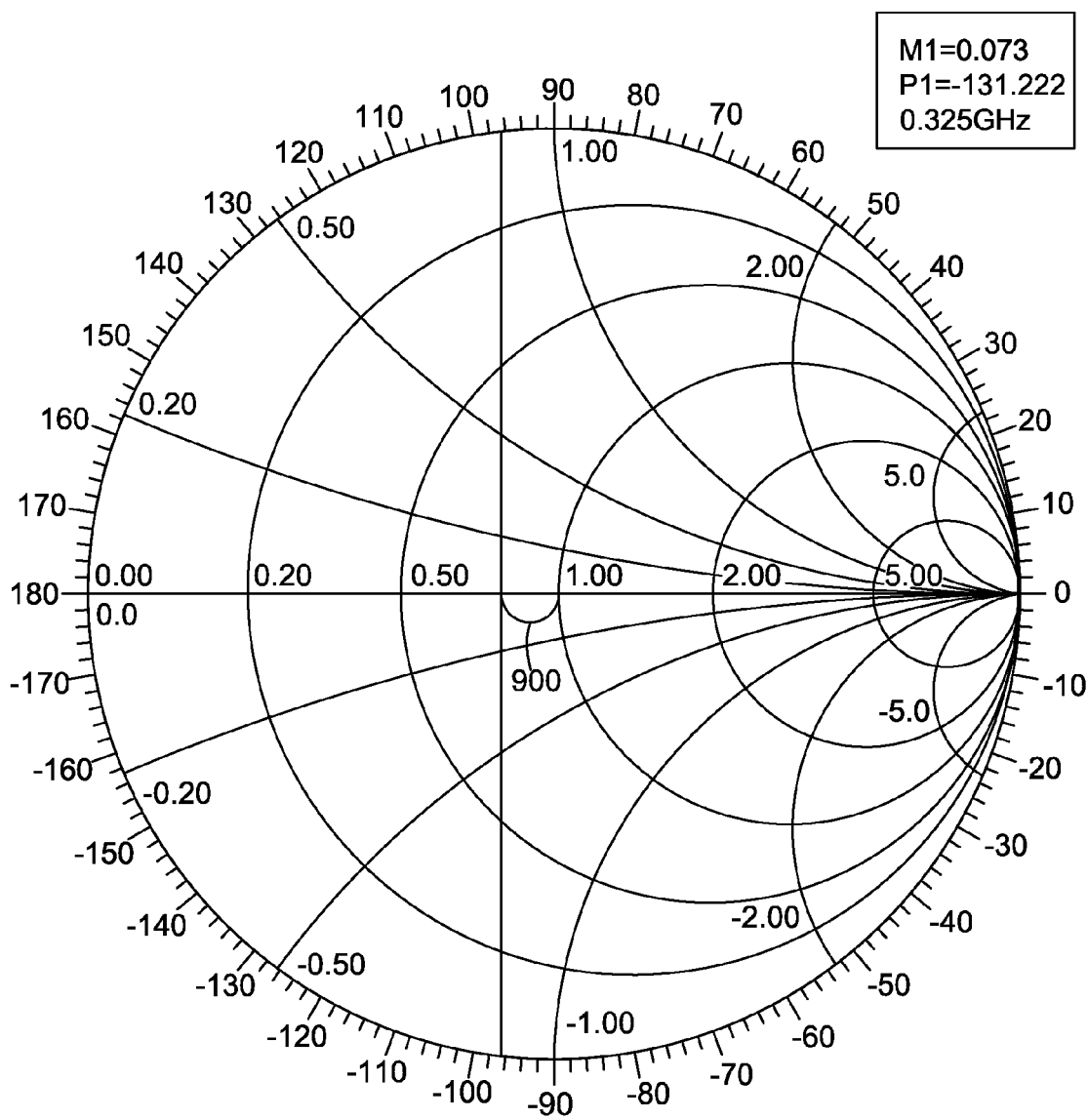
FIG. 9 is a Smith chart of the electrical signal of FIGS. 7 and 8.

Turning to FIG. 9, a Smith chart of the reflected back-propagating RF wave 216, which was reflected by the termination circuit 510, is shown. The Smith chart of FIG. 9 represents the same signal as the one represented by the spectral plots 700 and 800 of FIGS. 7 and 8, respectively. In the Smith chart of FIG. 9, a half-circle 900 denotes the evolution of the amplitude and the phase of the reflected back-propagating RF wave 216 as the frequency sweeps from 0 to 20 GHz. At zero frequency, the reflection is absent because the impedance is perfectly matched to that of the traveling-wave optical modulator 210. As the frequency increases, the amplitude of the reflection increases and the phase evolves from 0 degrees towards −180 degrees.

Figure 10A:
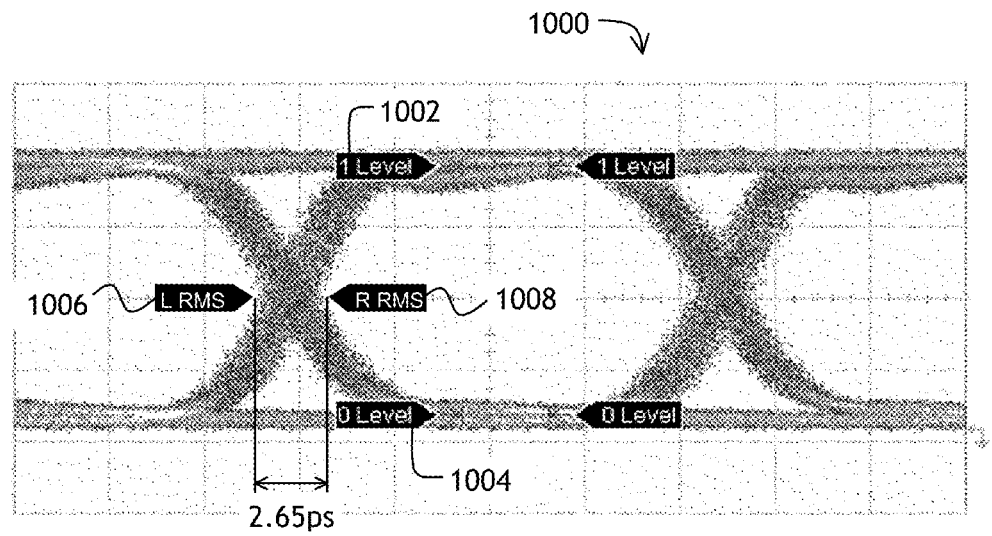
FIGS. 10A and 10B are eye diagrams of the optical modulator of FIG. 2 terminated with an impedance-matching terminating circuit and with the electrical termination circuit of FIG. 2, respectively.
Figure 10B:
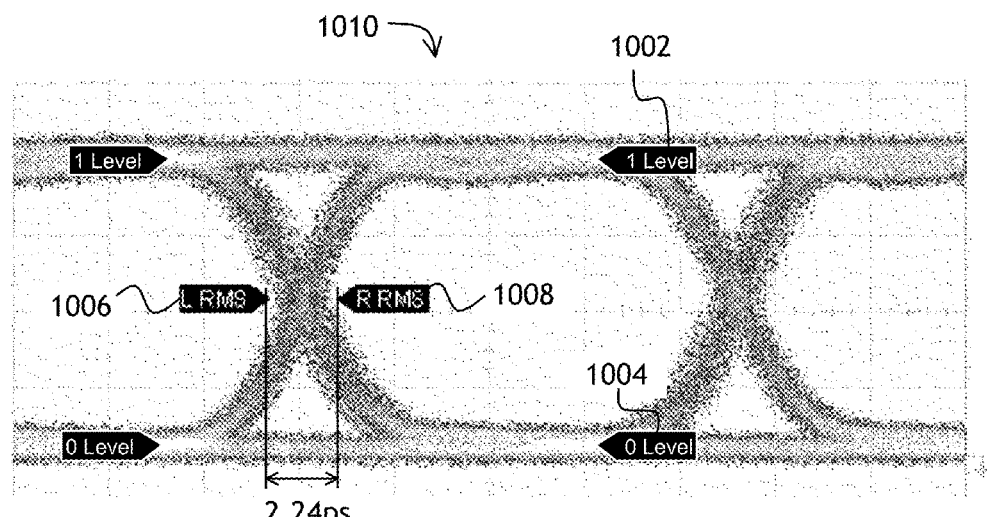

Referring now to FIGS. 10A and 10B, digital eye diagrams 1000 and 1010 represent optical performance of the traveling-wave optical modulator 200 terminated with an impedance-matched resistance and with the termination circuit 510, respectively. The "1 Level" and "0 Level" markers 1002 and 1004 denote average level locations of digital "1" and "0" levels, respectively. The "L RMS" and "R RMS" markers 1006 and 1008 represent RMS times of occurrence of 0.5 level of "1→0" and "0→1" transitions. The difference between the "R RMS" and "L RMS" times is the RMS jitter in the digital optical signal. One can observe by comparing the digital eye diagrams 1000 and 1010 that using the termination circuit 510 of the invention results in the RMS jitter improvement of 0.41 ps, or 18% improvement. Thus, suppression of the spectral feature 302 using the termination circuit 510 of the invention results in a considerable improvement of the performance of the optical modulator 200.

The termination circuit 210, 510, or 610 can be used to terminate various optoelectronic devices, including Mach-Zehnder optical modulators, electroabsorption modulators, photodetectors, and lasers. Not only acoustic resonance caused features, but other detrimental spectral features having an in quadrature (imaginary) component relative to the traveling RF wave, for example spectral undulations due to parasitic couplings within an electro-optical medium, can be suppressed. Furthermore, almost arbitrary spectral shapes of a response function can be generated by an appropriately selecting resistive and reactive elements for the termination circuit 210. Although the termination circuit 210 can include one or two resistive and one reactive (preferably capacitive) element, the total number of elements is not limited to two or three elements. One of skill in the art of electrical circuit design will recognize that complex phase and amplitude profiles of the reflected RF wave 216 can be created by providing an appropriate network of interconnected reactive and resistive elements. Herein, the term "reactive" is understood as capacitive or inductive or both.

Similarly, when the termination circuit is realized using transmission lines, such as the transmission line 600 used in the termination circuit 610 of FIG. 6, the total number and disposition of the transmission lines may vary to suit a particular amplitude and phase profiles of the reflected back-propagating RF wave 216 required to suppress a variety of undesired spectral features in an electro-optical transfer function of a traveling wave optical device. The position and the length of these transmission lines would have to be selected according to established rules of transmission line design to achieve the required amplitude and phase profiles of the reflected back-propagating RF wave 216.

Figure 11:
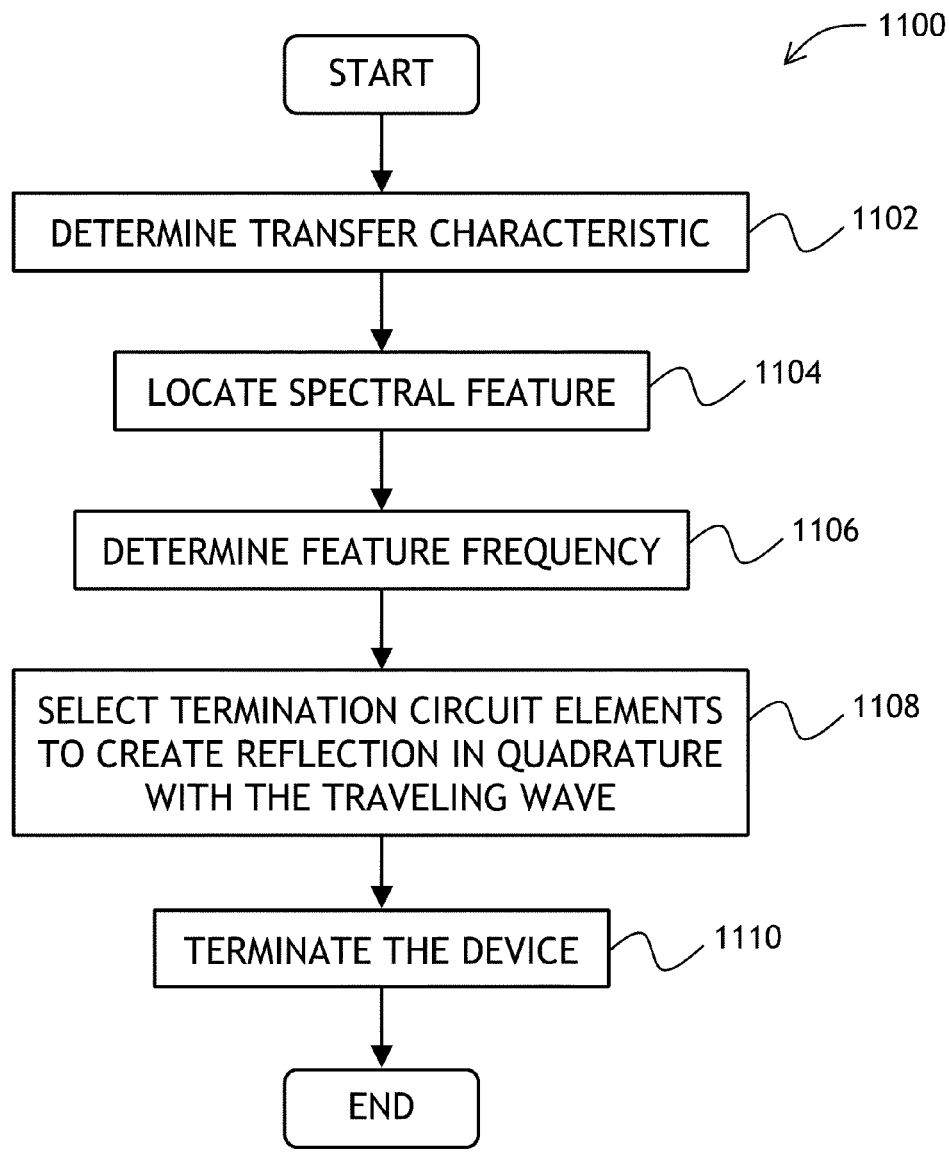
FIG. 11 is a block diagram of a method of terminating an optoelectronic device according to the invention.

Referring now to FIG. 11, a method 1100 for terminating the traveling-wave optoelectronic device 200 is presented by means of a block diagram. In a step 1102, a transfer characteristic of the traveling-wave optoelectronic device is obtained. The transfer characteristic can be determined using an electrical termination circuit having an impedance matched to the impedance of the optoelectronic device 200.

In a step 1104, the detrimental spectral feature, such as the spectral feature 302 in the transfer characteristic 300, is located. In this step, the spectral features can be detected, for example, by calculating a smoothed or averaged transfer characteristic and by selecting any spectral feature departing from the calculated smoothed or averaged transfer characteristic by a pre-defined value such as 1 dB or 2 dB.

In a step 1106, the frequency 304 of the spectral feature 302 located in the step 1104 is obtained. Further, in a step 1108, a first resistive element, such as the element 502, and a reactive element, such as the element 504, are selected for an electrical termination circuit, such as the electrical termination circuit 510. The element 506 is also optionally selected in this step. The resistive and the reactive elements 502, 504, and 506 are selected so as to create, in operation, the reflected back-propagating RF wave 216 having the component 406 in quadrature with the traveling RF wave 214 at the frequency 304 determined in the step 1106, for suppressing the spectral feature 302 located in the step 1104. The amplitude of the reflected wave will depend on the magnitude of the spectral feature 302. As a guiding example, for the spectral feature 302 having a magnitude of 1.5 dB, the magnitude of the reflection coefficient of the termination circuit 510 should be 8%+−4% of the traveling RF wave 214. Further, for acoustically caused spectral features, the resistive and the reactive elements 502, 504, and 506 are selected so as to produce the reflected back-propagating RF wave 216 out of phase with the traveling RF wave by 135±30 degrees or by 225±30 degrees.

In a step 1110, the traveling-wave optoelectronic device 200 is terminated with the electrical termination circuit of the step 1108.

When the termination circuit 210 includes transmission lines such as the transmission line 600 of the termination circuit 610 of FIG. 6, the step 1108 includes selecting the length L and the position d of the transmission line 600 in the termination circuit 610, so as to obtain the required values of amplitude and phase of the reflected back-propagating RF wave 216, as explained above.

What is claimed is:

1. An electrical termination circuit for a traveling-wave optoelectronic device, comprising a first resistive element and a reactive element,
   wherein the traveling-wave optoelectronic device has a transfer characteristic having a spectral feature at a first frequency of a radio-frequency wave traveling through the optoelectronic device, wherein the spectral feature is caused by acoustic effects in the optoelectronic device; and
   wherein the first resistive element and the reactive element have such a resistance and a reactance, which, in use, create a reflected radio-frequency wave having a component in quadrature with the traveling radio-frequency wave at the first frequency, for suppressing the spectral feature caused by the acoustic effects in the optoelectronic device.

2. The electrical termination circuit of claim 1, wherein the first resistive element and the reactive element are connected in parallel.

3. The electrical termination circuit of claim 2, wherein the reactive element includes a capacitor, the electrical termination circuit further including a second resistive element connected in series with the first resistive element.

4. The electrical termination circuit of claim 3, wherein in use, the reflected radio-frequency wave at the first frequency is out of phase with the traveling radio-frequency wave at the first frequency by 135±10 degrees or by 225±10 degrees.

5. An optical device comprising:
a traveling-wave optoelectronic device having a transfer characteristic having a spectral feature at a first frequency of a radio-frequency wave traveling through the optoelectronic device, wherein the spectral feature is caused by acoustic effects in the optoelectronic device; and
an electrical termination circuit coupled to the traveling-wave optoelectronic device, the electrical termination circuit comprising a first resistive element and a reactive element,
wherein the first resistive element and the reactive element have such a resistance and a reactance, which, in use, create a reflected radio-frequency wave having a component in quadrature with the traveling radio-frequency wave at the first frequency, for suppressing the spectral feature caused by the acoustic effects in the optoelectronic device.

6. The optical device of claim 5, wherein the optoelectronic device is selected from the group consisting of a Mach-Zehnder optical modulator, an electroabsorption modulator, a photodetector, and a laser.

7. The optical device of claim 5, wherein the reactive element includes a capacitor.

8. The optical device of claim 7, wherein the electrical termination circuit further includes a second resistive element connected in series with the first resistive element, wherein the second resistive element is coupled to the traveling-wave optoelectronic device, and the first resistive element is coupled to ground.

9. The optical device of claim 8, wherein the optoelectronic device is an optical modulator.

10. The optical device of claim 9, wherein the optical modulator includes a lithium niobate crystal.

11. The optical device of claim 9, wherein the reflected radio-frequency wave at the first frequency is out of phase with the traveling radio-frequency wave at the first frequency by 135±10 degrees or by 225±10 degrees.

12. A method for terminating a traveling-wave optoelectronic device, comprising:
(a) providing a traveling-wave optoelectronic device having a transfer characteristic having a spectral feature at a first frequency of a radio-frequency wave traveling through the optoelectronic device, wherein the spectral feature is caused by acoustic effects in the optoelectronic device;
(b) selecting a first resistive element and a reactive element for an electrical termination circuit for the traveling-wave optoelectronic device so as to create, in operation, a reflected wave having a component in quadrature with the traveling wave at the first frequency for suppressing the spectral feature caused by acoustic effects in the optoelectronic device; and
(c) terminating the traveling-wave optoelectronic device with the electrical termination circuit of step (b).

13. The method of claim 12, wherein step (a) includes:
(a1) obtaining a transfer characteristic of the traveling-wave optoelectronic device;
(a2) locating the spectral feature in the transfer characteristic caused by acoustic effects in the optoelectronic device; and
(a3) determining a frequency of the spectral feature located in step (a2).

14. The method of claim 12, wherein step (b) further includes selecting a second resistive element for the electrical termination circuit, wherein the first and the second resistive elements are connected in series, and wherein selecting the reactive element includes selecting a capacitor, wherein the capacitor is connected in parallel with the first resistive element.

15. The method of claim 12, wherein the reflected radio-frequency wave at the first frequency is out of phase with the traveling radio-frequency wave at the first frequency by 135±10 degrees or by 225±10 degrees.

16. The method of claim 13, wherein in step (a1), the transfer characteristic is obtained using an electrical termination circuit having an impedance matched to the impedance of the optoelectronic device.

17. An electrical termination circuit for a traveling wave optoelectronic device having an electro-optical transfer characteristic having a spectral ripple feature at a first frequency of a traveling electromagnetic wave propagating through the optoelectronic device, the electrical termination circuit comprising a resistive element and a reactive element connected in parallel, wherein the resistive element and the reactive element have such a resistance and a reactance that, in operation, the electrical termination circuit creates a reflected electromagnetic wave having a component in quadrature with the traveling electromagnetic wave at the first frequency, whereby in operation, the spectral ripple feature of the electro-optical transfer characteristic is suppressed.

\* \* \* \* \*